United States Patent
Kanetaka

(10) Patent No.: US 8,525,333 B2
(45) Date of Patent: Sep. 3, 2013

(54) ELECTRONIC DEVICE AND MANUFACTURING METHOD THEREFOR

(75) Inventor: Yoshifumi Kanetaka, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 44 days.

(21) Appl. No.: 12/736,191

(22) PCT Filed: Mar. 17, 2009

(86) PCT No.: PCT/JP2009/055130
§ 371 (c)(1),
(2), (4) Date: Sep. 17, 2010

(87) PCT Pub. No.: WO2009/116517
PCT Pub. Date: Sep. 24, 2009

(65) Prior Publication Data
US 2011/0006433 A1    Jan. 13, 2011

(30) Foreign Application Priority Data
Mar. 17, 2008   (JP) ................................. 2008-068034

(51) Int. Cl.
*H01L 23/52*   (2006.01)
*H01L 23/48*   (2006.01)
*H01L 29/40*   (2006.01)

(52) U.S. Cl.
USPC .................. 257/738; 257/E23.069; 257/737; 257/780; 438/612; 438/613

(58) Field of Classification Search
USPC ............... 257/E21.499, E23.141, 773, 737, 257/738, 778, 776, 784, 786, 693, E23.021, 257/E23.069, 780; 438/125, 612–614
See application file for complete search history.

(56) References Cited

U.S. PATENT DOCUMENTS

| | | | | |
|---|---|---|---|---|
| 6,657,124 B2 * | 12/2003 | Ho | ................................. | 174/521 |
| 6,677,677 B2 * | 1/2004 | Kimura et al. | ................. | 257/737 |
| 6,762,495 B1 * | 7/2004 | Reyes et al. | .................... | 257/737 |
| 7,112,883 B2 * | 9/2006 | Hasunuma | .................... | 257/714 |
| 7,126,227 B2 * | 10/2006 | Yamaguchi | .................... | 257/778 |
| 7,215,026 B2 * | 5/2007 | Park et al. | ...................... | 257/737 |
| 7,368,821 B2 * | 5/2008 | Kim et al. | ...................... | 257/738 |
| 7,615,865 B2 * | 11/2009 | Kang et al. | ..................... | 257/737 |
| 7,855,443 B2 * | 12/2010 | Tsai et al. | ...................... | 257/686 |

(Continued)

FOREIGN PATENT DOCUMENTS

| | | |
|---|---|---|
| JP | 8-70062 A | 3/1996 |
| JP | 10-13012 A | 1/1998 |

(Continued)

*Primary Examiner* — Chris Chu
(74) *Attorney, Agent, or Firm* — McGinn IP Law Group, PLLC

(57) ABSTRACT

An electronic device includes the electronic element, the interposer substrate, on one surface of which the electronic element is mounted, and the interconnection substrate, on one surface of which the interposer substrate is mounted. One portion of the connection parts is an electrical connection part that electrically interconnects the interposer substrate and the interconnection substrate. The remaining portion is a dummy connection part that produces no functional deficiency even when the dummy connection part does not electrically interconnect the interposer substrate with the interconnection substrate. The dummy connection part includes at least one of the connection parts that at least partially overlap with the electronic element in a plan projection and are preferably arranged along an outer rim of the plan projection of the electronic element.

13 Claims, 6 Drawing Sheets

(56) References Cited

U.S. PATENT DOCUMENTS

| | | | |
|---|---|---|---|
| 7,923,852 B2* | 4/2011 | Chen | 257/787 |
| 2006/0035510 A1* | 2/2006 | Numata et al. | 439/372 |
| 2006/0267215 A1* | 11/2006 | Ogawa et al. | 257/778 |
| 2007/0164448 A1* | 7/2007 | Kim et al. | 257/778 |

FOREIGN PATENT DOCUMENTS

| | | |
|---|---|---|
| JP | 10-56093 A | 2/1998 |
| JP | 10-154726 A | 6/1998 |
| JP | 2001-298112 A | 10/2001 |
| JP | 2004-200197 A | 7/2004 |
| JP | 2004-281473 A | 10/2004 |

* cited by examiner

RELATED ART

ELECTRONIC DEVICE AND MANUFACTURING METHOD THEREFOR

REFERENCE TO RELATED APPLICATION

This invention claims the benefits (priority) of JP Patent Application 2008-068034 filed on Mar. 17, 2008, which is hereby incorporated by reference herein in its entirety.

TECHNICAL FIELD

This invention relates to an electronic device, such as a semiconductor device, obtained on packaging an electronic element package, for example, a semiconductor package, on an interconnection substrate. The electronic element package is a packaged electronic element, such as a packaged semiconductor chip.

BACKGROUND

FIG. 12 illustrates a schematic cross sectional view of an electronic device of the related art. An electronic device 81 includes an electronic element package 82 and an interconnection substrate 92. The electronic element package 82 is obtained on mounting an electronic element 83 on an interposer substrate 85 and sealing the resulting assembly with an encapsulation resin 84. The interconnection substrate 92 has mounted thereon the electronic element package 82. The electronic element package 82 and the interconnection substrate 92 are electrically connected to each other via an electrical connection part 93. The electrical connection part 93 is formed by electrically connecting a package electrode for electrical connection 86 of the electronic element package 82 and a substrate electrode 90 of the interconnection substrate 92 via solder bumps 88.

The electronic element 83 is packaged on the interposer substrate 85 by, for example, flip chip packaging in which an electrode of the electronic element 83 and an electrode of the interposer substrate 85 are electrically connected to each other via e.g., solder bumps.

In the electronic device 81, shown in FIG. 12, the coefficients of thermal expansion of the electronic element 83, the interposer substrate 85 and the interconnection substrate 92 differ in general from one another. Hence, if the temperature of the electronic element 83, the interposer substrate 85 and the interconnection substrate 92 is elevated due to heat evolution during use or to heating during the manufacturing process, the respective components undergo differential thermal expansion and contraction. As a result, the electrical connection part 93 (solder bump connection) between the electronic element 83, the interposer substrate 85 and the interconnection substrate 92 is susceptible to cracking due to warp caused by the differential thermal expansion or contraction.

Recently, the shifting from tin lead solder to lead-free solder is going on rapidly under environmental regulations. The melting temperature of tin lead eutectic solder composed of, for example, 63 wt % of Sn, with the balance being Pb, is 183° C., whereas that of lead-free solder, composed mainly of tin and also including, for example, silver, copper, zinc, bismuth, indium, antimony, nickel and germanium, is high and is in a range of 190° C. to 230° C. Viz., if the lead-free solder is used, the packaging temperature is higher by 20° C. to 30° C. than if the tin lead solder is used. Hence, the risk of cracking is higher with the use of the lead-free solder.

The technique of enhancing the connection reliability between the electronic element package and the interconnection substrate or that between the electronic element and the interposer is disclosed in Patent Documents 1 to, for example.

The semiconductor device disclosed in Patent Document 1 includes an interconnection layer formed on a substrate or on an IC chip, electrode connection bumps connected to the interconnection layer and arranged on the substrate or on the IC chip, and dummy connection bumps arranged outside the electrode connection bumps and adapted for moderating the stress applied to the electrode connection bumps.

An interconnection substrate disclosed in Patent Document 2 is such an interconnection substrate in which an interconnection conductor is arranged in the inside of a square-shaped insulation substrate of ceramics. A large number of connection pads, electrically connected to interconnection conductors, are formed on the major surface of the insulation substrate. There are two sorts of the connection pads, namely first connection pads formed in a square-shaped pattern along the outer rim of the insulation substrate and second connection pads formed in a lattice pattern in a square-shaped center region of the insulation substrate. Four elliptically-shaped reinforcement dummy pads whose longitudinal axis extends towards the center of the insulation substrate are provided on the major surface of the insulation substrate between the pads arranged at angular parts of the square-shaped array of the first connection pads and the pads arranged at angular parts of the radially outermost lattice array of the second connection pads.

A semiconductor device disclosed in Patent Document 3 is such a semiconductor device in which a semiconductor element is mounted in a face-down configuration on a major surface of a substrate by flip chip packaging, with bumps arranged in-between. A real electrode pad of the semiconductor element and a real electrode terminal of the substrate are interconnected by solder bumps. A plurality of dummy electrode pads are provided on the semiconductor element and a plurality of dummy electrode terminals are provided on the substrate in association with the dummy electrode pads. The dummy electrode pads and the dummy electrode terminals are interconnected by gold bumps.

A semiconductor package, disclosed in Patent Document 4, is such a semiconductor package in which a set of solder bumps for mounting semiconductor components are formed on an interconnection substrate. The solder bumps are formed by providing a solder material on connection pads formed of metal conductors, and a resin spacer for providing the spacing between a semiconductor component and the connection pad is provided within the region of the solder bumps.

[Patent Document 1] JP Patent Kokai Publication No. JP-P2004-200197A
[Patent Document 2] JP Patent Kokai Publication No. JP-P2004-281473A
[Patent Document 3] JP Patent Kokai Publication No. JP-A-10-154726
[Patent Document 4] JP Patent Kokai Publication No. JP-A-10-13012

SUMMARY

The entire disclosures of the above Patent Documents 1 to 4 are incorporated herein by reference.

The following analysis is made from the perspective of the present invention.

FIG. 9 shows a schematic cross sectional view of an electronic device according to the comparative example illustrating the problem to be solved by the present invention. FIG. 10 illustrates a schematic cross sectional view taken along line X-X of FIG. 9. In FIG. 10, a plan projection of an electronic element 83 is indicated by a chain line. It is now assumed that a semiconductor chip is used as the electronic element 83. The coefficient of thermal expansion of silicon, used frequently as a semiconductor chip material, is 2 ppm/° C. to 4 ppm/° C. It is also assumed that an organic resin material is used as materials of the interposer substrate 85 and the interconnection substrate 92. The coefficient of thermal expansion of this organic resin material is 10 ppm/° C. to 100 ppm/° C., which is several to dozens of times as high as that of silicon. It is here assumed that the temperature changes of the electronic element 83, the interposer substrate 85 and the interconnection substrate 92 are about equal to one another. Attention is to be focused now on a region of the interposer substrate 85 of the electronic element package 82 where the electronic element 83 is secured. In such region, the electronic element 83 suppresses the thermal expansion and contraction of the interposer substrate 85. Thus, in such region, the thermal expansion and contraction of the interposer substrate 85 is smaller than those in a region of the interposer substrate where the electronic element 83 is not secured. Thus, even granting that the coefficient of thermal expansion of the interposer substrate 85 and that of the interconnection substrate 92 are proximate to each other, there is produced a difference between the values of thermal expansion and thermal contraction of the interposer substrate 85 and those of the interconnection substrate 92. Such difference is caused due to suppression of the thermal expansion and contraction of the interposer substrate 85 by the electronic element 83. As a result, in an electrical connection part 93 that electrically interconnects the package electrode for electrical connection 86 of the interposer substrate 85 directly below the electronic element 83 and the substrate electrode 90 of the interconnection substrate 92, there is produced a stress larger than that produced in the electrical connection part 93 which is not directly below the electronic element 83. Viz., a larger stress is induced in a bump 88*a* arranged in a region overlapping with the plan projection of the electronic element 83 in FIG. 10 than the stress induced in a bump 88*b* arranged in a region not overlapping with the plan projection of the electronic element 83.

In particular, the electronic element package 82, such as BGA (Ball Grid Array) or CSP (Chip Size Package) frequently has no encapsulation resin between the interposer substrate 85 and the interconnection substrate 92. Hence, a crack 94 is likely to be induced in the bump 88*a* directly below the electronic element 83. In particular, the difference between the thermal expansion and contraction of the interposer substrate 85 and those of the interconnection substrate 92 becomes greater the remoter the bump of interest is from the center 83*a* of the electronic element 83. Viz., out of the bumps 88*a* overlapping with the plan projection of the electronic element 83, those solder bumps 88*a* arranged in regions A (circle marks) and in regions B (ellipsis marks) are susceptible to cracking 94. In particular, the solder bumps 88*a* in the region A remotest from the center 83*a* of the electronic element 83 are most liable to undergo the cracking 94.

FIG. 11 depicts a photo showing a cross section of a semiconductor device in which a semiconductor element is used as the electronic element 83. It is seen that, in the semiconductor device, shown in FIG. 11, cracks occur in the bumps 88*a* arranged below the outer rim of the semiconductor device 83. These bumps 88*a* are among the solder bumps 88*a*, 88*b* electrically connecting the interposer substrate 85 and the interconnection substrate 92 to each other, as shown in FIGS. 9 and 10.

If the crack 94 occurs in one of the solder bumps 88, the cracks 94 are further propagated in other bumps 88 due to the differential in thermal expansion and contraction between the interposer substrate 85 and the interconnection substrate 92. Ultimately, the package electrode for electrical connection 86 of the interposer substrate 85 is completely disconnected from the substrate electrode for electrical connection 90 of the interconnection substrate 92, as a result of which the electronic device 81 falls into disorder.

To improve the reliability in electrical conduction of the electronic device 81, it is thus necessary that any crack is prevented from occurring in the electrical connection parts arranged along an outer edge of the electronic element 83 and, in particular, the connection parts provided below the four corners of the electronic element 83 remotest from the center 83*a* of the electronic element 83, among the electrical connection parts 93 directly below the electronic element 83.

If the electronic element 83 is flip chip packaged to the interposer substrate 85, the electronic element 83 and the interposer substrate 85 are usually sealed with encapsulation resin. Thus, even if there is produced a difference between the thermal expansion and contraction of the electronic element 83 and those of the interposer substrate 85, the cracking in the solder bump is suppressed by the encapsulation resin.

In a semiconductor device disclosed in Patent Document 1, dummy connection bumps are arranged outside the electrode connection bumps. In this configuration, the reliability in electrical connection of the electrode connection bumps directly below the IC chip may not be improved.

In an interconnection substrate, disclosed in Patent Document 2, even if an electronic element is arranged on an interconnection substrate, it is not possible for reinforcement dummy pads to improve the reliability in electrical connection in the connection pads arranged on an outer edge of the electronic device. These connection pads are among the connection pads arranged directly below the electronic element.

In a semiconductor device disclosed in Patent Document 3 and in a semiconductor package disclosed in Patent Document 4, the connection reliability between an electronic element and an interposer substrate as shown in the drawings may be improved by a dummy electrode terminal and a resin spacer. It is however not possible for this technique to improve the connection reliability between the interconnection substrate and the interposer substrate on which the electronic element is mounted.

It is an object of the present invention to provide an electronic device exhibiting high reliability in electrical connection between the interconnection substrate and the interposer substrate, carrying thereon an electronic element, and a manufacturing method therefore.

In a first aspect of the present invention, an electronic device is provided, which comprises an electronic element, an interposer substrate having mounted on one surface thereof the electronic element, an interconnection substrate having mounted on one surface thereof the interposer substrate, and a plurality of connection parts interconnecting the interposer substrate and the interconnection substrate. One portion of the connection parts is an electrical connection part(s) that electrically interconnects the interposer substrate with the interconnection substrate. The remaining portion is a dummy connection part(s) that produces no functional deficiency even when the dummy connection part fails to electrically interconnect the interposer substrate with the interconnection substrate. The dummy connection part(s) is/are at least one out of the connection parts at least partially overlapping with the electronic element in a plan projection.

In a preferred mode of the first aspect, among the connection parts that at least partially overlap with the electronic element in the plan projection, the dummy connection part is at least one of the connection parts that are arranged along an outer rim of the electronic element in a plan projection.

In a preferred mode of the first aspect, among the connection parts that at least partially overlap with the electronic element in the plan projection, the dummy connection part is at least one of the connection parts that are provided closest to angular parts of the electronic element in a plan projection.

In a preferred mode of the first aspect, the connection part includes a first electrode formed on the other surface of the interposer substrate, a second electrode formed on the one surface of the interconnection substrate, and a connection material interconnecting the first and second electrodes. In the electrical connection part, the connection material is an electrically conductive material electrically connecting the first and second electrodes to each other. In the dummy connection part, the connection material is an electrically conductive material electrically connecting the first and second electrodes to each other or a joining material that joins the first and second electrodes to each other.

In a preferred mode of the first aspect, the Young's modulus of the connection material in the dummy connection part is higher than that of the connection material in the electrical connection part.

In a preferred mode of the first aspect, the dummy connection part is continuously formed along an outer rim of the plan projection of the electronic element in a region at least partially overlapping with the electronic element in the plan projection.

In a preferred mode of the first aspect, the connection material in the dummy connection part is a resin, an electrically conductive resin or an electrically conductive paste.

In a second aspect of the present invention, a manufacturing method for an electronic device is provided, which comprises mounting an electronic element on an interposer substrate to provide an electronic element package, and mounting the interposer substrate on an interconnection substrate. At least one of a plurality of connection parts interconnecting the interposer substrate and the interconnection substrate is formed as a dummy connection part that produces no function deficiency even if the dummy connection part fails to provide for electrical connection between the interposer substrate and the interconnection substrate. The dummy connection part is provided at a position at least partially overlapping the electronic element in a plan projection.

In a preferred mode of the second aspect, among the connection parts that at least partially overlap with the electronic element in the plan projection, at least one of the connection parts provided along the outer rim of the electronic element is formed as the dummy connection part.

In a preferred mode of the second aspect, among the connection parts that at least partially overlap with the electronic element in the plan projection, at least one of the connection parts that are provided closest to angular parts of the electronic element is formed as the dummy connection part.

In a preferred mode of the second aspect, a dummy connection part is continuously formed along an outer rim of the electronic element in a plan projection in a region that at least partially overlaps with the plan projection of the electronic element.

The present invention gives rise to at least one of the following meritorious effects:

Even if the stress attributable to the difference between the coefficient of thermal expansion of an electronic element and those of an interposer substrate and an interconnection substrate is applied to a connection part between the interposer substrate and the interconnection substrate, it is possible to suppress a crack in the electrical connection part by making the connection part(s) subjected to the large stress as a dummy connection part(s). It is thus possible to prevent functional deficiencies caused by failure in electrical conduction at the electrical connection part.

BRIEF DESCRIPTION OF THE DRAWINGS

The above and other objects, advantages and features of the present invention will be more apparent from the following description of certain preferred exemplary embodiments taken in conjunction with the accompanying drawings, in which.

DETAILED DESCRIPTION OF THE PREFERRED MODES

Figure 1:
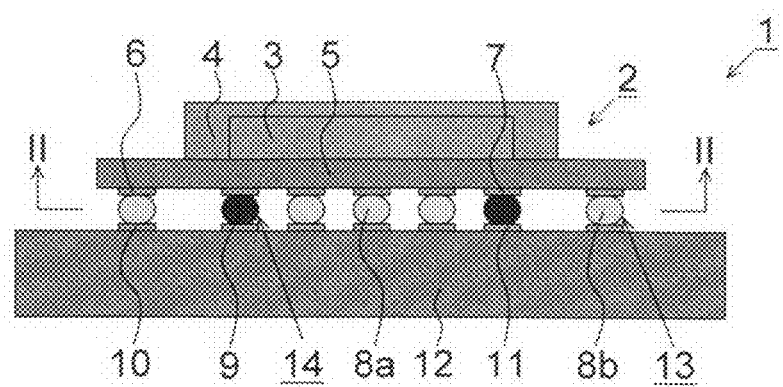
FIG. 1 is a schematic cross sectional view of an electronic device according to a first exemplary embodiment of the present invention.
Figure 2:
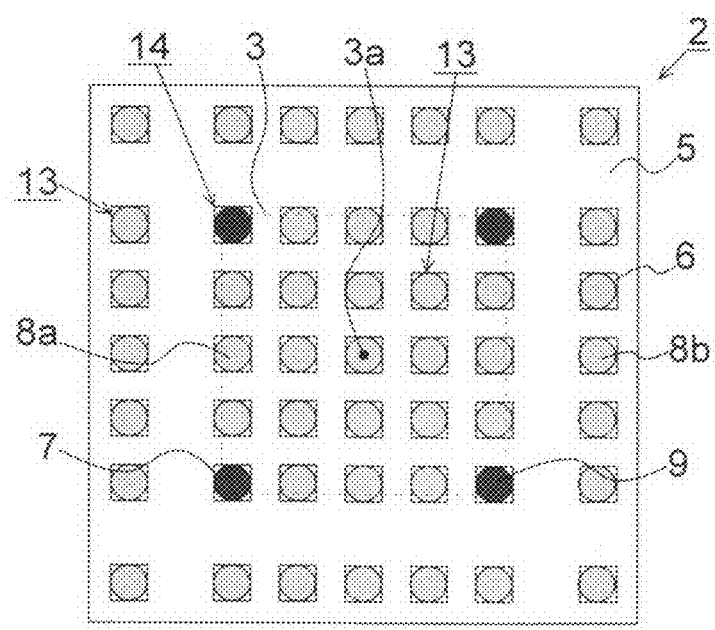
FIG. 2 is a schematic cross sectional view taken along line II-II of FIG. 1.

An electronic device according to a first exemplary embodiment of the present invention will now be described. FIG. 1 shows a schematic cross sectional view of an electronic device according to the first exemplary embodiment of the present invention, and FIG. 2 shows a schematic cross sectional view taken along line II-II of FIG. 1. The electronic device 1 includes an interconnection substrate 12 and an electronic element package 2 mounted on the interconnection substrate 12. The electronic element package 2 includes an interposer substrate 5, an electronic element 3 mounted on one surface of the interposer substrate 5, an encapsulation resin 4 for sealing the electronic element 3, package electrodes for electrical connection 6 provided on the other surface of the interposer substrate 5, and dummy package electrodes 7. There is no particular limitation to the mode of packaging of the electronic element 3 in the electronic element package 2, and flip chip packaging or wire bonding packaging, for example, may be used. The interconnection substrate 12 includes substrate electrodes for electrical connection 10 for connection to the electronic element package 2, and dummy substrate electrodes 11.

The electronic element package 2 is mounted on the interconnection substrate 12 via electrically conductive materials 8a, 8b formed between the package electrode for electrical connection 6 and the substrate electrode for electrical connection 10. Viz., the electronic element package 2 and the interconnection substrate 12 are electrically connected to each other via the electrically conductive materials 8a, 8b. In FIG. 2, a plan projection of the electronic element 3 is indicated by a chain line. It is noted that the electrically conductive materials 8a are arranged below the electronic element 3 in the plan projection. Or, the electrically conductive material 8a is at least partially overlapped with the electronic element 3 in the plan projection. The electrically conductive materials 8b are arranged not below the electronic element 3, that is, is not overlapped with the electronic element 3 in the plan projection. As the electrically conductive materials 8a, 8b, a solder, an electrically conductive adhesion agent or an electrically conductive paste, for example, may be used. If the solder is used, an Sn—Pb based solder, an Sn—Ag—Cu based solder, an Sn—Ag based solder, an Sn—Cu based solder, an Sn—Sb based solder, an Sn—Zn based solder or an Sn—In based solder may, for example, be used.

The dummy package electrode 7 of the electronic element package 2 and the dummy substrate electrode 11 of the interconnection substrate 12 are interconnected via connection materials 9. The term 'dummy' herein means that electrical connection between the electronic element package 2 and the interconnection substrate 12 is not aimed at, or that, granting that electrical connection is established, there is raised no functional deficiency in case of failure of such electrical connection. As an example of 'dummy', at least one out of the dummy package electrode 7 and the dummy substrate electrode 11 may not be electrically connected to the wiring of the electronic element package 2 or the interconnection substrate 12. As another example, any one out of the dummy package electrode 7, dummy substrate electrode 11 and the connection material 9 may be formed of an insulation material. As yet another example, even though an electrical connection has been established between the dummy package electrode 7 and the dummy substrate electrode 11 via the connection material 9, this electrical connection may be provided as backup for another electrical connection.

The materials of the dummy package electrode 7 and the dummy substrate electrode 11 may be the same as materials of the package electrode for electrical connection 6 and the substrate electrode for electrical connection 10. In this case, the dummy package electrode 7 or the dummy substrate electrode 11 may be prepared at the same time as the package electrode for electrical connection 6 or the substrate electrode for electrical connection 10 is prepared. It is thus possible to allow for maintaining the manufacture efficiency of the interposer substrate 5 or the interconnection substrate 12.

As the material type of the connection material 9, an electrically conductive material, such as solder or electrically conductive resin, and a resin that may improve the force of connection, may be used. If the electrically conductive material is used as the connection material 9, the same material as that of the electrically conductive materials 8a, 8b may be used. Such a material having the value of the Young's modulus higher than that of the electrically conductive materials 8a, 8b may be used. If the same material is used for the connection material 9 and for the electrically conductive materials 8a, 8b, the connection material 9 may be supplied at the same time as the electrically conductive materials 8a, 8b. Hence, there is no necessity for providing an additional process, thus promoting the efficiency. Moreover, if a material whose Young's modulus is higher than that of the material for the electrically conductive materials 8a, 8b is used as the material for the connection material 9, the connection material 9 is less liable to be distorted or elongated than the electrically conductive materials 8a, 8b. The difference between the thermal expansion or contraction of the interposer substrate 5 and that of the interconnection substrate 12 and hence the stress applied to the electrically conductive materials 8a, 8b may thus be reduced to suppress the crack.

In the following explanation, the connection part provided by the dummy package electrode 7, the dummy substrate electrode 11 and the connection material 9 is termed as a 'dummy connection part' 14. The connection part provided by the package electrode for electrical connection 6, the substrate electrode for electrical connection 10 and the electrically conductive materials 8a, 8b is termed as the 'electrical connection part' 13.

The dummy connection part 14 is provided at a position where it is at least partially overlapped with the electronic element 3 in a plan projection. Such position is as directly below the electronic element 3 in FIG. 1. Preferably, the dummy connection part 14 is formed at a position which is remotest from the center 3a of the electronic element 3 in a plan projection, among the connection parts, inclusive of the electrical connection parts, overlapping with the electronic element 3 in a plan projection. For example, if the planar shape of the electronic element 3 is a square, as shown in FIGS. 1 and 2, it may be preferred to provide the dummy connection part 14 at least one of the electrode positions (4 points) closest to the position directly below both ends of both diagonal lines of the electronic element 3, or the corners of the electronic element 3. It is more preferred to provide the dummy connection part 14 at such positions that a contour line (chain line) of the electronic element 3 runs in the cross sectional view of FIG. 2.

The dummy connection part 14 may be devoid of at least one out of the dummy package electrode 7 and the dummy substrate electrode 11. That is, in the dummy connection part 14, the electronic element package 2 and the interconnection substrate 12 may be directly interconnected without using the dummy package electrode 7 and the dummy substrate electrode 11, and may be interconnected using any one out of the dummy package electrode 7 and the dummy substrate electrode 11.

According to the present invention, if a stress is induced in the connection parts due to heat evolution or to heating, the difference in thermal expansion or contraction, generated between the interposer substrate and the interconnection substrate may be reduced by providing a dummy connection part in a region where the maximum stress is induced. It is thus possible to suppress a crack in the electrical connecting part. In particular, the connection material may be formed of a material whose Young's modulus is higher than that of the electrically conductive material, thus enhancing the above effect. If a crack is induced at the connection part below the electronic element, the initial crack is induced in the dummy connection part where the maximum stress is applied. Hence, there is no adverse effect on the function of the electronic device, and the generation of the crack in the electrical connection parts may be delayed. According to the present invention, an utmost effect may be obtained in case of using lead-free solder whose melting point is higher than that of the tin-zinc solder as an electrically conductive material.

Figure 3:
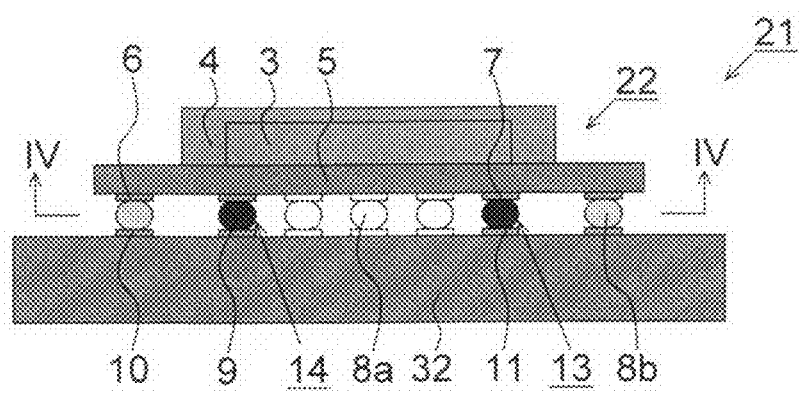
FIG. 3 is a schematic cross sectional view of an electronic device according to a second exemplary embodiment of the present invention.
Figure 4:
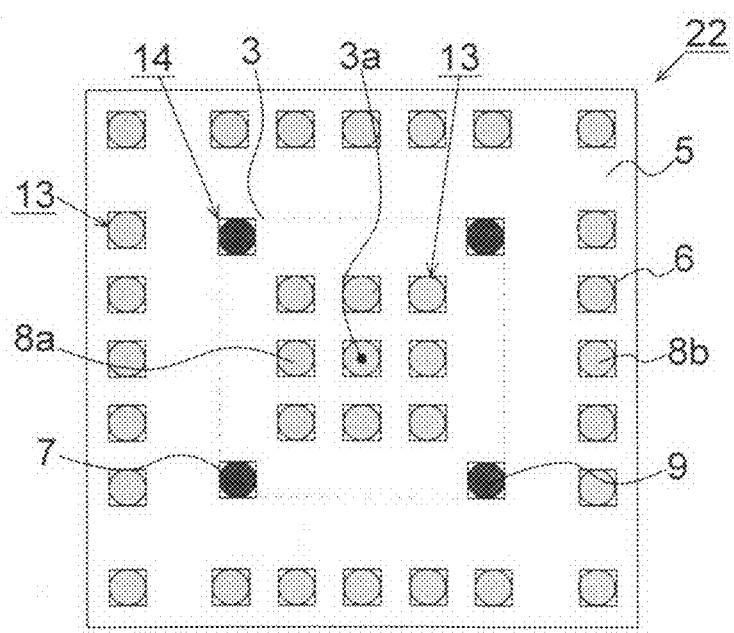
FIG. 4 is a schematic cross sectional view taken along line IV-IV of FIG. 3.

An electronic device according to a second exemplary embodiment of the present invention will now be described. FIG. 3 depicts a schematic cross sectional view of an electronic device according to the second exemplary embodiment, and FIG. 4 depicts a schematic cross sectional view taken along line IV-IV in FIG. 3. In the first exemplary embodiment, the dummy connection part is formed as a portion of a grid array of the electrical connection parts. In the present exemplary embodiment, the dummy connection part 14 is provided outside a grid array of electrical connection parts 13 provided in a region overlapping with a plan projection of the electronic element 3. The dummy connection part 14 may be provided at any place in a region overlapping at least partially with the electronic element 3 in the plan projection and, preferably, at the remotest position from the center 3a of the electronic element 3. Viz., if the electronic element 3 is square-shaped as shown in FIG. 4, it is preferred that the dummy connection parts 14 are provided below the four corners of the electronic element 3. In the second exemplary embodiment, the components other than the arrangements of the electrical connection parts 13 and the dummy connection parts 14 are the same as those of the first exemplary embodiment.

With the present exemplary embodiment, the meritorious effects which are the same as those of the first exemplary embodiment may be obtained, and it is possible to improve the reliability in electrical connection of the electronic device.

Figure 5:
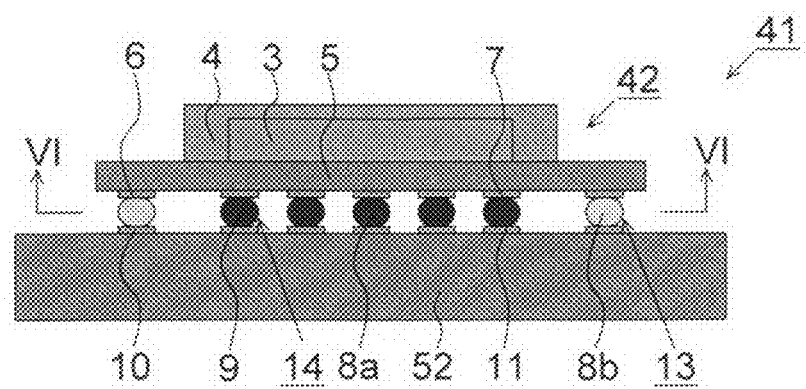
FIG. 5 is a schematic cross sectional view of an electronic device according to a third exemplary embodiment of the present invention.
Figure 6:
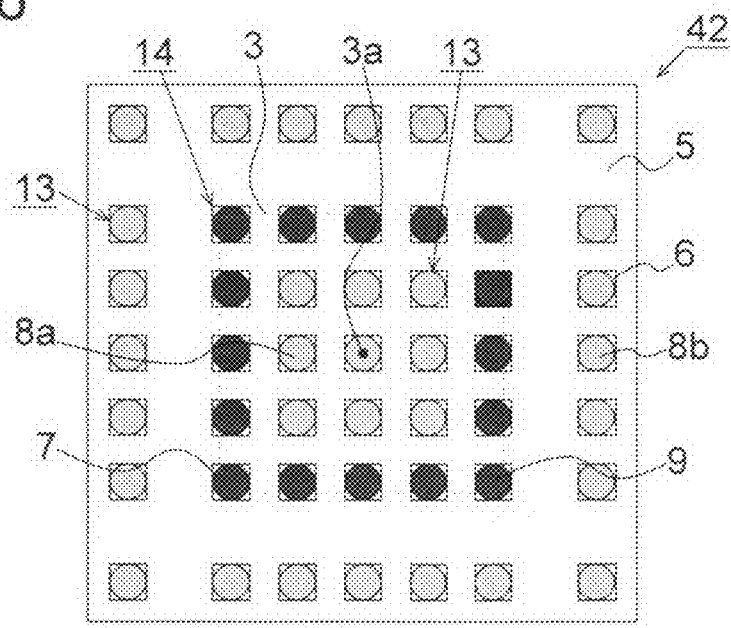
FIG. 6 is a schematic cross sectional view taken along line VI-VI of FIG. 5.

An electronic device according to a third exemplary embodiment of the present invention will now be described. FIG. 5 depicts a schematic cross sectional view of an electronic device according to the third exemplary embodiment, and FIG. 6 depicts a schematic cross sectional view taken along line VI-VI in FIG. 5. In the first exemplary embodiment, the dummy connection parts are provided at the four corners of the grid array of the electrical connection parts, viz., at the angular positions of the plan projection of the electronic element. In the present exemplary embodiment, the dummy connection parts 14 are the connection parts arranged along an outer rim of the electronic element 3 among the connection parts arranged in a region at least partially overlapping with the plan projection of the electronic element 3. Viz., the dummy connection parts 14 are arranged encircling the grid array of the electrical connection parts 13 provided in a region overlapping with the electronic element 3. Specifically, the dummy connection parts 14 are arranged facing an outer side of the grid array composed of the dummy connection parts 14 and the electrical connection parts 13. Hence, the dummy connection parts 14 are arranged at the locations closest to the outer rim (contour line) of the electronic element 3. As regards the components other than the arrangements of the electrical connection parts 13 and dummy connection part 14, the present exemplary embodiment is similar to the first exemplary embodiment.

With the present exemplary embodiment, the crack in the electrical connection parts may be suppressed more effectively.

Figure 7:
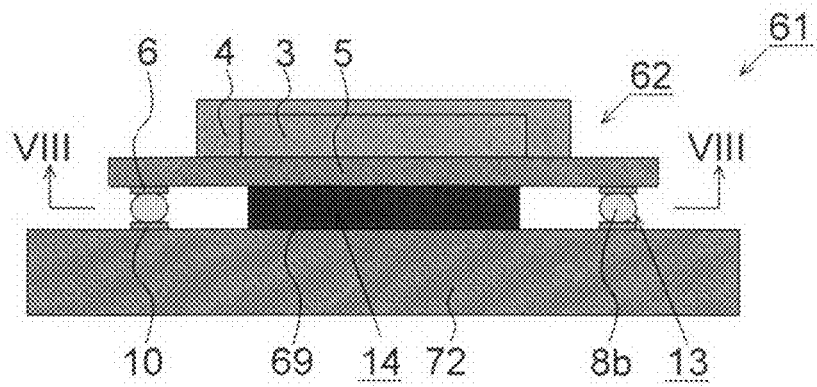
FIG. 7 is a schematic cross sectional view of an electronic device according to a fourth exemplary embodiment of the present invention.
Figure 8:
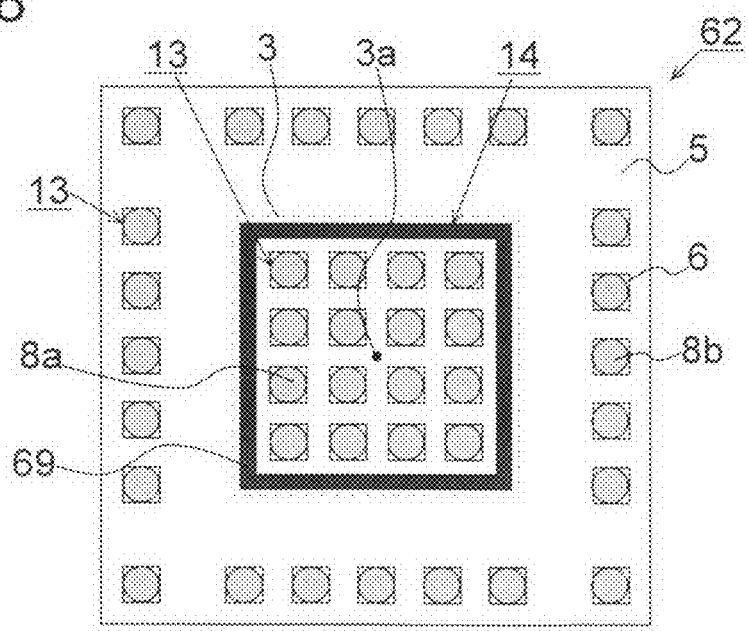
FIG. 8 is a schematic cross sectional view taken along line VIII-VIII of FIG. 7.
Figure 9:
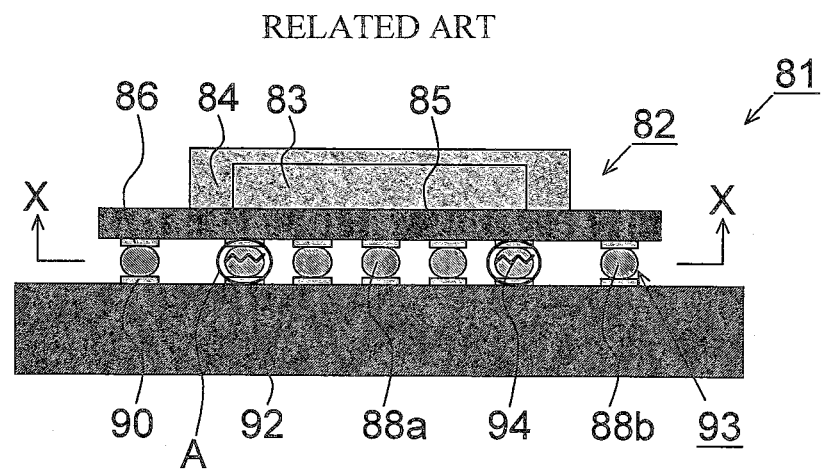
FIG. 9 is a schematic cross sectional view of an electronic device of the related art for illustrating the problem to be solved by the present invention.
Figure 10:
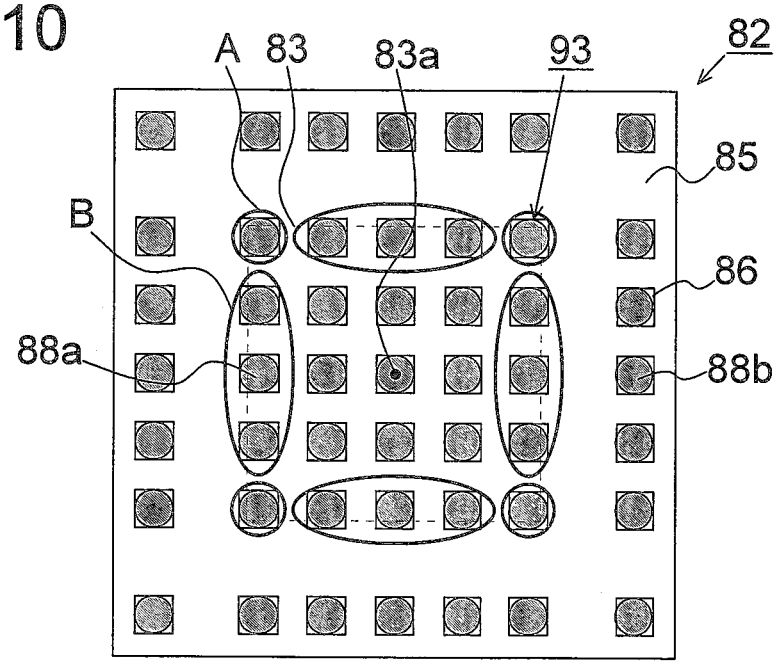
FIG. 10 is a schematic cross sectional view taken along line X-X of FIG. 9.
Figure 11:
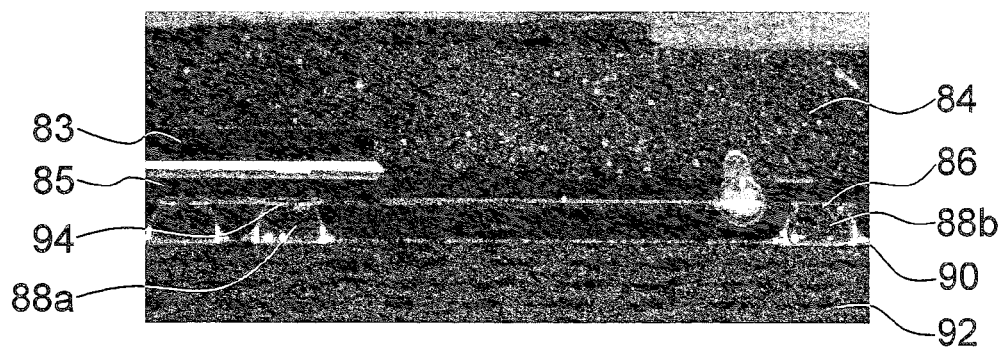
FIG. 11 is a photo showing the cross section of a semiconductor device for illustrating the problem to be solved by the present invention.
Figure 12:
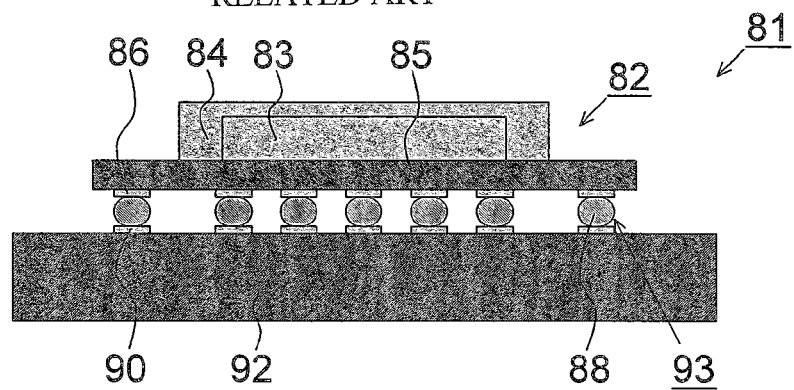
FIG. 12 is a schematic cross sectional view of an electronic device of the related art.

An electronic device according to a fourth exemplary embodiment of the present invention will now be described. FIG. 7 depicts a schematic cross sectional view of an electronic device according to the fourth exemplary embodiment, and FIG. 8 depicts a schematic cross sectional view taken along line VIII-VIII in FIG. 7. In the first to third exemplary embodiments, the dummy connection part 14 has a similar mode to the electrical connection part. In the present fourth exemplary embodiment, the dummy connection part 14 is formed mainly of a connection material 69 containing the resin. As the connection material 69 may, a resin material, such as epoxy resin, silicon resin, phenolic resin, diallyl phthalate resin, polyimide resin, acrylic resin and urethane resin, an electrically conductive adhesion agent and an electrically conductive paste may be used, for example. The connection material 69 may be supplied by a dispensing method or by printing.

The dummy connection part 14 is provided in at least a portion on an outer side of the grid array of the electrical connection parts 13 in a region overlapping with the plan projection of the electronic element 3. Preferably, the dummy connection part 14 is provided continuously to encircle a grid array of the electrical connection parts 13 or along the outer rim of the plan projection of the electronic element 3 in the region overlapping with the plan projection of the electronic element 3, as shown in FIG. 8. In the mode shown in FIGS. 7 and 8, the dummy connection part 14 is not provided with the dummy package electrode and the dummy substrate electrode as explained in the first exemplary embodiment. However, the dummy connection part may be provided with at least one out of the dummy package electrode and the dummy substrate electrode. In this case, the dummy package electrode and the dummy substrate electrode are preferably formed in continuation along the outer rim of the electronic element 3 or so as to encircle the grid array of the electrical connection parts 13. In the fourth exemplary embodiment, the components other than the modes and arrays of the electrical connection part 13 and the dummy connection part 14 are similar to those of first exemplary embodiment.

According to the present exemplary embodiment, by using the resin for the dummy connection part 14, the reliability of the electrical connection for the electronic device may be improved as in the first exemplary embodiments and the like.

A manufacturing method for the electronic device according to the first exemplary embodiment of the present invention will now be described with reference to FIGS. 1 and 2. Initially, the electronic element 3 is mounted on the interposer substrate 5 by, for example, flip chip packaging. The mounted electronic element 3 is then sealed with the encapsulation resin 4. This completes the electronic element package 2. The electronic element package 2 is then mounted on the interconnection substrate 12 using the conductive materials 8a, 8b and the connection materials 9. In case where the conductive materials 8a, 8b and the connection materials 9 are formed of the same material, the conductive materials 8a, 8b and the connection material 9 may be supplied by the same process. However, in case where the conductive materials 8a, 8b and the connection material 9 are formed of different materials, it is preferred that the materials for the conductive materials 8a, 8b and the connection material 9 are separately supplied. In case where the dummy package electrode 7 and the dummy substrate electrode 11 are electrically connected to each other, at least one out of the electronic element package 2 and the interconnection substrate 12 is designed and constructed so as to raise no functional problems even in case of breakage of the electrical connection of the dummy connection part 14. The packaging method for the electronic element package 2 and the interconnection substrate 12 may be any suitable packaging method routinely employed. The modes of the position for providing the dummy connection part 14, the materials of the conductive materials 8a, 8b and the connection material 9 and the like are the same as those indicated in the above explanation and hence are not here explained for simplicity. The electronic devices according to the second to fourth exemplary embodiments may be manufactured in a similar manner.

Each exemplary embodiment is explained using a BGA as an example for the mounting mode between the electronic element package and the interconnection substrate. The present invention is not limited to the BGA and may be applied to a variety of exemplary embodiments, such as LGA.

An electronic device of the present invention have been described based on the abovementioned exemplary embodiments, but there is no limitation to the abovementioned exemplary embodiments, and clearly various changes, modifications, improvements, and the like within the scope of the invention are included. Furthermore, various combinations, substitutions and selections of disclosed elements are possible within the scope of the present invention.

Further problems, objects and expanded modes of the present invention will be apparent from the entire disclosed matter of the present invention including the claims.

INDUSTRIAL APPLICABILITY

The electronic device of the present invention may be preferably applied to devices in which electronic elements, exemplified by active elements such as semiconductor devices and by passive elements such as capacitors, are mounted.

What is claimed is:

1. An electronic device, comprising:
   an electronic element;
   an interposer substrate having mounted on one surface thereof said electronic element;
   an interconnection substrate, comprising on one surface thereof, said interposer substrate; and
   a plurality of connection parts interconnecting said interposer substrate and said interconnection substrate,
   wherein one portion of said connection parts comprises an electrical connection part that electrically interconnects said interposer substrate with said interconnection substrate, and a remaining portion comprises a dummy connection part that produces no functional deficiency even when said dummy connection part fails to electrically interconnect said interposer substrate with said interconnection substrate,
   wherein said dummy connection part comprises at least one out of said connection parts at least partially overlapping with said electronic element in a plan projection,
   wherein said dummy connection part overlaps the electronic element at a location on the element which is farthest from a center of said electronic element,
   wherein the plurality of connection parts comprises a connection material, and a Young's modulus of said connection material in said dummy connection part is greater than a Young's modulus of said connection material in said electrical connection part,
   wherein the electrical connection part comprises a first electrical connection part overlapping the electronic element and a second electrical connection part not overlapping the electronic element in the plan projection,
   wherein the one surface of the interconnection substrate has a substantially rectangular shape and an imaginary diagonal line, and
   wherein a distance between the dummy connection part and the first electrical connection part which is next to the dummy connection part is shorter than a distance between the dummy connection part and the second electrical connection part which is next to the dummy connection part along the imaginary diagonal line.

2. The electronic device according to claim 1, wherein, among said connection parts that at least partially overlap with said electronic element in the plan projection, said dummy connection part comprises at least one of said connection parts that are arranged along an outer rim of said electronic element in said plan projection.

3. The electronic device according to claim 2, wherein, among said connection parts that at least partially overlap with said electronic element in the plan projection, said dummy connection part comprises at least one of said connection parts that are provided closest to angular parts of said electronic element in said plan projection.

4. The electronic device according to claim 2, wherein said connection parts include a first electrode formed on an other surface of said interposer substrate, a second electrode formed on said one surface of said interconnection substrate,
   wherein the connection material interconnects said first and second electrodes,
   wherein, in said electrical connection part, said connection material comprises an electrically conductive material electrically connecting said first and second electrodes to each other, and
   wherein, in said dummy connection part, said connection material comprises an electrically conductive material electrically connecting one of said first and second electrodes to each other and a joining material that joins said first and second electrodes to each other.

5. The electronic device according to claim 1, wherein, among said connection parts that at least partially overlap with said electronic element in the plan projection, said dummy connection part comprises at least one of said connection parts that are provided closest to angular parts of said electronic element in said plan projection.

6. The electronic device according to claim 5, wherein said connection parts include a first electrode formed on an other surface of said interposer substrate, a second electrode formed on said one surface of said interconnection substrate,
   wherein the connection material interconnects said first and second electrodes,
   wherein, in said electrical connection part, said connection material comprises an electrically conductive material electrically connecting said first and second electrodes to each other, and
   wherein, in said dummy connection part, said connection material comprises an electrically conductive material electrically connecting one of said first and second electrodes to each other and a joining material that joins said first and second electrodes to each other.

7. The electronic device according to claim 1, wherein said connection parts further include a first electrode formed on an other surface of said interposer substrate, a second electrode formed on said one surface of said interconnection substrate,
   wherein the connection material interconnects said first and second electrodes,
   wherein, in said electrical connection part, said connection material comprises an electrically conductive material electrically connecting said first and second electrodes to each other, and
   wherein, in said dummy connection part, said connection material comprises an electrically conductive material electrically connecting said first and second electrodes to each other or a joining material that joins said first and second electrodes to each other.

8. The electronic device according to claim 7, wherein the connection material in said dummy connection part comprises one of a resin, an electrically conductive resin, and an electrically conductive paste.

9. The electronic device according to claim 1, wherein said dummy connection part is continuously formed along an outer rim of the plan projection of said electronic element in a region at least partially overlapping with said electronic element in the plan projection.

10. The electronic device according to claim 9, wherein the connection material in said dummy connection part comprises one of a resin, an electrically conductive resin, and an electrically conductive paste.

11. A semiconductor device, comprising:
an electronic element;
an interposer substrate having mounted on a surface thereof said electronic element;
an interconnection substrate comprising, on a surface thereof, said interposer substrate;
a plurality of connection parts interconnecting said interposer substrate and said interconnection substrate;
an electrical connection part that electrically interconnects said interposer substrate with said interconnection substrate; and
a dummy connection part, said dummy connection part comprising a connection material comprising a resin, said dummy connection part being configured to produce no functional deficiency when said dummy connection part fails to electrically interconnect said interposer substrate with said interconnection substrate, said dummy connection part being arranged to at least partially overlap with said electronic element in a plan view,
wherein said dummy connection part overlaps the electronic element at a location on the element which is provided along an outer rim of the electronic element,
wherein the electrical connection part comprises a first electrical connection part overlapping the electronic element and a second electrical connection part not overlapping the electronic element in the plan projection,
wherein the surface of the interconnection substrate has a substantially rectangular shape and an imaginary diagonal line, and
wherein a distance between the dummy connection part and the first electrical connection part which is next to the dummy connection part is shorter than a distance between the dummy connection part and the second electrical connection part which is next to the dummy connection part along the imaginary diagonal line.

12. The semiconductor device according to claim 11, wherein said dummy connection part is provided continuously, encircling a grid array of the electrical connection parts.

13. The semiconductor device according to claim 11, wherein said dummy connection part is provided along the outer rim of the region overlapping the electronic element, in the plan view.

* * * * *